United States Patent
Jiang et al.

(10) Patent No.: US 9,951,419 B2
(45) Date of Patent: Apr. 24, 2018

(54) APPARATUS AND METHOD FOR MAKING ATOMIC LAYER DEPOSITION ON FINE POWDERS

(76) Inventors: Ying-Bing Jiang, Albuquerque, NM (US); Hongxia Zhang, Albuquerque, NM (US)

( * ) Notice: Subject to any disclaimer, the term of this patent is extended or adjusted under 35 U.S.C. 154(b) by 608 days.

(21) Appl. No.: 13/602,315

(22) Filed: Sep. 3, 2012

(65) Prior Publication Data
US 2013/0059073 A1    Mar. 7, 2013

Related U.S. Application Data

(60) Provisional application No. 61/530,960, filed on Sep. 3, 2011.

(51) Int. Cl.
*C23C 16/44*    (2006.01)
*C23C 16/455*   (2006.01)
*C04B 35/622*   (2006.01)

(52) U.S. Cl.
CPC .... *C23C 16/4417* (2013.01); *C04B 35/62222* (2013.01); *C23C 16/4412* (2013.01);
(Continued)

(58) Field of Classification Search
CPC .. B01J 2/006; C04B 35/628–35/62842; C04B 35/62844–35/62881;
(Continued)

(56) References Cited

U.S. PATENT DOCUMENTS 3,213,827 A * 10/1965 Jenkin ........................... 118/725
4,118,522 A * 10/1978 Stellmach ............... A61J 3/005
                                                              118/13
(Continued)

FOREIGN PATENT DOCUMENTS

JP         52068886 A  *  6/1977
KR          556317 B1  *  3/2006
(Continued)

OTHER PUBLICATIONS

M. Leskelä, M. Ritala. "Atomic Layer Deposition Chemistry: Recent Developments and Future Challenges." Angew. Chem. Int. Ed. 42 (45) (2003) 5548-5554.*
(Continued)

*Primary Examiner* — Jeffrie R Lund
*Assistant Examiner* — Stanislav Antolin

(57) ABSTRACT

Method and apparatus for making atomic layer deposition on powdered materials are provided. A rotary vessel with tilted rotation axis can be used as the deposition chamber. The rotary vessel can be directly used as the deposition chamber, or the rotary vessel is positioned inside a vacuum chamber that serves as the deposition chamber. A hallow shaft can be used to deliver rotary motion and facilitate pumping. A tube can be inserted into the hollow shaft or the rotary vessel to introduce precursors. Gas diffuser and slowly increased pumping speed can be used to reduce the agitation caused by gas flow. Intermittent rotation, variable rotary speed, extruding structures on inner surface of the rotary vessel, and the addition of easy-to-agitate powder or beads of other materials can be used to enhance the powder agitation caused by rotation.

20 Claims, 7 Drawing Sheets

(52) U.S. Cl.
CPC .. *C23C 16/45544* (2013.01); *C23C 16/45555* (2013.01); *C23C 16/45561* (2013.01); *Y10T 428/2982* (2015.01)

(58) Field of Classification Search
CPC .............. C04B 35/62884; C04B 41/45; C04B 41/4529; C04B 41/4531; C04B 1/4533; C23C 16/4417; C23C 16/45525–16/45555; C23C 16/45544; C23C 16/458; C23C 16/505; B22F 1/02–1/025; H01J 37/3211; H01J 37/32449; H01J 37/32458; Y10T 428/29–428/2998; Y10T 428/2982
USPC ................................................. 118/719, 715
See application file for complete search history.

(56) References Cited

U.S. PATENT DOCUMENTS

| | | | | |
|---|---|---|---|---|
| 4,326,480 | A | * | 4/1982 | Glatt .................... A23G 3/26 118/19 |
| 4,810,524 | A | * | 3/1989 | Nakayama ............ B01J 19/088 204/169 |
| 5,069,972 | A | * | 12/1991 | Versic ..................... B01J 13/04 252/1 |
| 5,288,504 | A | * | 2/1994 | Versic .................. A61K 9/5026 424/400 |
| 5,366,764 | A | * | 11/1994 | Sunthankar ................. 427/248.1 |
| 5,472,749 | A | * | 12/1995 | Dravid .................... B01J 13/02 219/76.15 |
| 6,197,120 | B1 | * | 3/2001 | David ..................... B01J 2/006 118/716 |
| 6,372,346 | B1 | * | 4/2002 | Toth ............................. 428/403 |
| 6,913,652 | B2 | * | 7/2005 | Shan ............................ 118/719 |
| 7,632,355 | B2 | * | 12/2009 | Toth ....................... B22F 1/02 118/716 |
| 9,492,805 | B2 | * | 11/2016 | Gleason ............... A61K 9/2077 |
| 2003/0026989 | A1 | * | 2/2003 | George ................... B01J 2/006 428/402 |
| 2003/0070618 | A1 | * | 4/2003 | Campbell ........... C23C 16/4401 118/715 |
| 2003/0091741 | A1 | * | 5/2003 | Schmoyer ................. 427/255.28 |
| 2004/0052984 | A1 | * | 3/2004 | Toth ......................... B22F 1/02 428/34.1 |
| 2004/0247799 | A1 | * | 12/2004 | Lee ............................. 118/715 |
| 2005/0227019 | A1 | * | 10/2005 | Hama ...................... B08B 5/02 427/581 |
| 2006/0193978 | A1 | * | 8/2006 | Toth ......................... B22F 1/02 427/212 |
| 2006/0196418 | A1 | * | 9/2006 | Lindfors et al. ............. 118/715 |
| 2006/0254903 | A1 | * | 11/2006 | Abe ......................... B01J 13/04 204/192.11 |
| 2007/0032620 | A1 | * | 2/2007 | Gleason .................. C09D 4/00 526/217 |
| 2007/0104860 | A1 | * | 5/2007 | Gleason ............... A61K 9/2077 427/2.14 |
| 2007/0207625 | A1 | * | 9/2007 | Aggarwal .......... C23C 16/4412 438/758 |
| 2007/0213212 | A1 | * | 9/2007 | Abe ......................... B01J 23/42 502/313 |
| 2008/0073127 | A1 | * | 3/2008 | Zhan ........................ B24D 3/02 175/434 |
| 2008/0314646 | A1 | * | 12/2008 | Lockwood ................ B22F 1/02 175/374 |
| 2010/0326322 | A1 | * | 12/2010 | King .................... C01G 23/047 106/286.4 |
| 2011/0003088 | A1 | * | 1/2011 | Honda ..................... B01J 2/006 427/569 |
| 2011/0041764 | A1 | * | 2/2011 | Webb et al. ................... 118/715 |
| 2011/0146697 | A1 | * | 6/2011 | Mola et al. .................... 131/345 |
| 2011/0168454 | A1 | * | 7/2011 | Keshavan ............... E21B 10/56 175/428 |
| 2011/0200822 | A1 | * | 8/2011 | Detavernier ........ C23C 16/4417 428/402 |
| 2011/0236575 | A1 | * | 9/2011 | King .................... C04B 41/009 427/214 |
| 2012/0045700 | A1 | * | 2/2012 | King ..................... C23C 16/342 429/406 |

FOREIGN PATENT DOCUMENTS

| | | | | |
|---|---|---|---|---|
| KR | 1020040013610 A | * | 3/2006 | |
| KR | 667281 B1 | * | 1/2007 | |
| WO | WO 2007145657 A2 | * | 12/2007 | ........... A61K 9/2077 |
| WO | WO 2009098784 A1 | * | 8/2009 | .............. B01J 2/006 |
| WO | WO 2009121698 A1 | * | 10/2009 | .............. A24D 3/163 |
| WO | WO 2010046373 A2 | * | 4/2010 | ......... C23C 16/4417 |

OTHER PUBLICATIONS

V. Dal Santo et al. "Tailored Supported Metal Nanoparticles by CVD: An Easy and Efficient Scale-Up by a Rotary Bed OMCVD Device," J. Mater. Chem., 2009, 19, 9030-9037.*

J. A. McCormick. "Atomic Layer Deposition on Nanoparticles in a Rotary Reactor." Doctoral Thesis, Chemical Engineering, University of Colorado at Boulder. 2007. pp. 1-189. Source location: ProQuest Dissertations & Theses Global.: http://search.proquest.com/docview/304889052? Accesses Sep. 3, 2015.*

"Büchi Rotavapor R-200/205 Rotary Evaporator Manual." 2001. pp. 1-60. Source location: Büchi Labortechnik AG.: http://www.buchi.com/. Available: http://www.americaninstrument.com/pdf/2066D-EVAP.pdf. Accesses Sep. 5, 2015.*

H. Itoh et al. "Preparation of Titanium Nitride Coated Powders by Rotary Powder Bed Chemical Vapour Deposition." J. Mater. Sci. vol. 23, 1, pp. 43-47 (1988).*

* cited by examiner

APPARATUS AND METHOD FOR MAKING ATOMIC LAYER DEPOSITION ON FINE POWDERS

CROSS-REFERENCE TO RELATED APPLICATIONS

The present invention relates generally to making coatings or surface modifications on powdered materials (including small fibers). More particularly, the present invention relates to an improved apparatus for making coatings or surface modifications on powdered materials via a deposition process using sequential precursor exposures, for example, the so-called atomic layer deposition (ALD) process.

FIELD OF THE INVENTION

The present invention relates generally to making coatings or surface modifications on powdered materials (including small fibers). More particularly, the present invention relates to an improved method and apparatus for making coatings or surface modifications on powdered materials via a deposition process using sequential precursor exposures, for example, the so-called atomic layer deposition (ALD) process.

BACKGROUND OF THE INVENTION

Atomic Layer deposition (ALD) process is a layer-by-layer deposition process comprising alternative exposure and purge steps, where the precursors react with the sample surface in a sequentially one-at-a-time manner. A typical ALD process may include the following steps: 1) place a sample in a sealed chamber, evacuate the chamber with a vacuum pump, and keep the sample at certain temperature; 2) introduce the first precursor, say, precursor A, into the chamber. Precursor A may or may not be carried by an inert gas that is called "carrier gas". In this step, precursor A will chemically react with the sample surface, forming a chemisorbed layer of molecules of precursor A on the sample surface. This step is usually called as "precursor-exposure" step; 3) pump or purge the chamber so as to remove un-reacted precursor A and reaction byproducts, leaving the chemisorbed layer of molecules of precursor A on the sample surface. This step is usually called as "purge" step; 4) introduce the second precursor, say, precursor B, into the chamber, and precursor B will chemically react with the sample surface, converting the chemisorbed layer of molecule A into a solid deposition. Again, this step is called as "precursor-exposure" step; 5) pump or purge the chamber so as to remove un-reacted precursor B and byproducts, providing a fresh surface for another layer of chemisorptions of precursor A. Again, this step is called "purge" step; 6) repeating step 2 to 5 to achieve a number of layers as needed, so as to obtain the thickness of the coating as needed. Detailed ALD process may vary, but they all comprise alternating "precursor-exposure" step and "purge" step, and materials are deposited on a surface in a layer-by-layer manner.

Using an ALD process, the physical or/and chemical properties of a sample surface can be modified, and coatings can build up in a one-atomic-layer by one-atomic-layer fashion, with thickness control in atomic-level precision. In addition, the coatings or modifications are usually uniform and conformal throughout the whole sample surface because the surface reaction and surface adsorption are usually uniform and conformal.

Typically, an ALD apparatus comprises a deposition chamber with at least one pumping port so as to remove gas from the chamber, and at least one gas-injection port so as to bring gas into the chamber.

In general, a successful ALD process requires a good precursor-exposure step and a purge step, which means that precursor molecules should be able to freely reach the sample surface; and after the reaction of precursors at the sample surface, the reaction byproduct and un-reacted residual precursors should be able to be removed easily from the sample surface vicinity. In addition, during the steps of precursor introduction and gas removal, the sample should stay inside of the deposition chamber instead of being blown away by the gas flow.

For a wafer sample, the above requirements can be easily satisfied because the surface geometry of a wafer is simply flat. Transport of gas molecules to and away from this flat surface is easy. In addition, the wafer samples are usually heavy enough so that the samples won't be blown away by the gas flow.

However, when running ALD on small particles, or powdered materials, there are at least three issues: 1) for a plurality of powders, the powders buried at the bottom have less chance to be exposed to the reactant gases, causing problem for "precursor-exposure" step; 2) the gas molecules trapped in between of powders at the bottom have a less chance to be pumped or purged away, causing problem for "purge" step, resulting in non-ALD depositon in these locations; 3) the powders are light and can be easily blown away by the gas flow during the steps of introducing precursors for "precursor-exposure" and the step of pumping for "purge", making powders being carried by gas flow thereby sticking on the chamber walls, or entering the pumping port as mentioned in paragraph [0005].

Despite of above issues, there is an increasing interest in doing ALD on powdered samples (including small fibers) as ALD can be used to modify the surface property of the powdered samples, or to make a thin layer of catalytic or other functional materials on the powder surface. For example, ALD of platinum on porous carbon powders is of great interest in fuel cells applications; ALL) of oxide on porous powders can be used for battery electrodes, or super capacitors; ALD of photocatalytic $TiO_2$ on porous powders can be used for water or air detoxification; ALD of catalysts on ceramics powders can be used to remove NO, CO etc from auto exhaust or the flue gas from electrical plants etc.

To facilitate ALD on powder samples, some researchers have developed a fluidized-bed ALD system, where the powders are blown up and dispersed by turbulent gas flow so that all the powders can have good chances to be exposed to the reactant gases. But there are several disadvantages in this approach: 1) the ALD chamber has to be relatively large to satisfy the configuration of a "fluidized bed", e.g. several feet in height, especially when less reactive precursors are used and longer residence time is needed to complete the reaction; 2) fluidized bed also requires relatively high gas pressure and large gas flow so that the particles can be blown up by the gas flows which causes a big waste of carrier gases; 3) powders will fly around vigorously inside the chamber, and a porous filter with small pores has to be used to prevent powders from being pumped away, but this porous filter will trap powders no that many powders are wasted by being trapped inside the pores. Further, once the powders are trapped inside the pores, the filter will be blocked. As a consequence, the filter has to be cleaned or replaced frequently; 4) since powders will fly around inside the chamber, many powders will stick on the chamber walls or be trapped in the porous filters, which are hard to collect after ALD, causing waste of powders and contamination for the following ALD process. Therefore, for this fluidized-bed ALD system, it is hard to process a very small amount of powder due to loss of powders in the filter and the chamber walls. It doesn't work very well if research-scale small amount of powdered samples are processed. [Ferguson et al, *Powder Technol, No.* 156, page 154, 2005]

In another known art, an ALD system with rotary cylinder is used for powder ALD [McCormick et al, *J. of Vac. Sci. and Technol. A*, January/February 2007, p 67]. In this art, the ALD chamber is a rotary cylinder, which rotates along a horizontal axis to agitate the powders so as to help achieving good results in "precursor-exposure" step and the "purge" step. In this known art, there are two distinctive features: 1) the cylinder rotates along a horizontal axis; 2) a porous filter has to be used to prevent powders from being blown away. Again, the porous filter will trap powders and may be blocked by the powders after long-term usage.

Therefore, there is a need of developing improved ALD system to process powdered samples, wherein: 1) powders are agitated so that powders buried in the bottom of the pile can be constantly brought to the top of the pile, enabling all powders to have a good chance to be exposed to reactant or purge gases during the "precursor-exposure" and "purge" steps; 2) powders won't be blown away by gas flow, and powders are confined within the ALD chamber without using porous filters.

SUMMARY OF THE INVENTION

In the embodiments of this invention, we provide an improved method and apparatus for making coatings or surface modifications on powdered materials (including small fibers) via a layer-by-layer deposition process using alternating "precursor-exposure" and "purge" steps, such as the so-called atomic layer deposition process.

In one aspect of the embodiment of this invention, a rotary vessel is used as the container of the powdered samples, and the powders are agitated by the rotary movement so as to improve the efficacy of "precursor-exposure" and "purge" steps.

However, different from previous known art, which relies on using porous filters to confine the powders within the chamber, mechanism is provided so that the gravity of the powders is employed to confine the powders within the chamber as gravity tends to pull the powders down to the bottom of the chamber. To facilitate this mechanism of confining powder, the ALD chamber shall be configured in such a way that the opening of the ALD chamber, which is the pumping port of the ALD chamber, shall be high enough compared to the "maximum height that most powders can reach".

To satisfy this configuration, the rotation axis of the rotary vessel is tilted so that the pumping port can be located at a higher position. Therefore, a rotary vessel is used as the container of the powdered materials or small fibers, wherein the rotary vessel can rotate along a rotation axis that is non-horizontally positioned, and the angle between the said rotation axis and the horizontal orientation can be in the range of 15°-89°; and the rotary axis meets with the outer surface of the rotary vessel at an upper end and a lower end of the rotary vessel. An opening that can function as the pumping port is positioned at the upper end of the vessel, wherein gas(es) or(and) vapor(s) can be introduced into or removed from the vessel through the opening.

This tilted rotary vessel can be used directly as the deposition chamber; or can be positioned inside another vacuum vessel that functions as the deposition chamber.

When the tilted rotary vessel is used directly as the deposition chamber, a hollow shaft can be connected to the upper end of the tilted rotary vessel; and the hollow shaft delivers rotary motion to the vessel, and gas(es) or(and) vapor(s) inside the rotary vessel can be pumped away through the hollow shaft; To introduce gas(es) or precursor(s) into the vessel, a tube can be inserted into the hollow shaft, wherein gas(es) or(and) precursor vapor(s) can be introduced into the rotary vessel through the said tube, and the tube has an outlet inside the hollow shaft or the rotary vessel.

When the rotary vessel is positioned inside a vacuum chamber, the vacuum chamber can function as the deposition chamber, and gas(es) or(and) vapor(s) can be introduced into or removed from the vacuum chamber. In addition, to introduce gas(es) or precursor(s) into the vessel, a tube can be inserted into the rotary vessel, wherein gas(es) or(and) precursor vapor(s) can be introduced into the rotary vessel through the said tube, and the tube has an outlet inside the hollow shaft or the rotary vessel.

In another aspect of the embodiments of this invention, to reduce the "maximum height that powders can reach", the agitation of powders caused by the gas flow must be minimized. To minimize the agitation caused by the gas flow during pulsed precursor introduction, the configuration of the gas injection port must be carefully designed. A "gas flow diffuser" can be installed at the gas injection port to slow down the gas flow velocity and enable the gas(es) to enter the ALD chamber in a smooth and gentle manner.

Besides the use of such a "gas flow diffuser", the mode of introducing precursor gases can also be carefully controlled (e.g., using a computer or controller). For example, the valve controlling precursor dosage can be opened briefly so that each time there is only a small amount of precursor gas introduced to the ALD chamber, and the amount is small enough so that it cannot cause a big agitation of the powders. And for each precursor exposure step, the valve can be opened briefly for multiple times to achieve enough precursors for the exposure.

To reduce the "maximum height that most powders can reach", agitations caused by gas flow shall be minimized. For this reason, the pumping speed can be low at the beginning when the gas pressure is relatively high in the ALD deposition chamber; as gas pressure reduces, higher pumping speed can be used. Therefore, a valve with variable pumping speed can be used, or multiple pumping pathways with different pumping speeds can be used either in the main pumping line or in the ALD chamber so that the pumping speed can be adjusted by using different pathway or different combination of the pathways for pumping.

In the other aspect of the embodiments of this invention, to enhance the powder agitation by rotary motion, extruding features, such as blades, fins, or other similar structures can be added to the inner side including the inner surface of the rotary vessel. In addition, besides a cylindrical vessel, the vessel can be made in other shapes. The rotary vessel can have a circular or non-circular cross-section when the cross-section of the rotary vessel is made to be perpendicular to the rotation axis; and the non-circular cross-section may include but not limited to oval, triangular, or polygonal cross-sections.

To enhance the powder agitation by rotary motion, the rotation speed can be non-constant, and the rotation can even be intermittent. To further enhance the powder agitation, small glass or ceramic beads or similar materials can be mixed with the powders during ALD.

In the other aspect of the embodiments of this invention, in the rotary powder-ALD system, the rotatable chamber is designed to be of low-cost, and be connected to the main ALD system via fast connections such as KF flanges, so that the chamber part can be removed from the main system conveniently for easy replacement/exchange or cleaning. The "low-cost" and "easy to replace/exchange" features make it possible for users to have a series of ALD chambers so that each chamber can be assigned to one specific sample, thereby avoiding inter-sample contaminations.

In the other aspect of the embodiments of this invention, a dual-chamber ALD apparatus can be built up wherein one chamber can be used for wafer samples and the other chamber is a rotary chamber that can be used for powdered samples. The two chambers share the same pumping system and the same precursor system.

BRIEF DESCRIPTION OF THE DRAWINGS

In the following, a more particular description of the invention may be had by reference to embodiments, some of which are illustrated in the appended drawings.

DETAILED DESCRIPTION OF THE EMBODIMENTS

Figure 1:
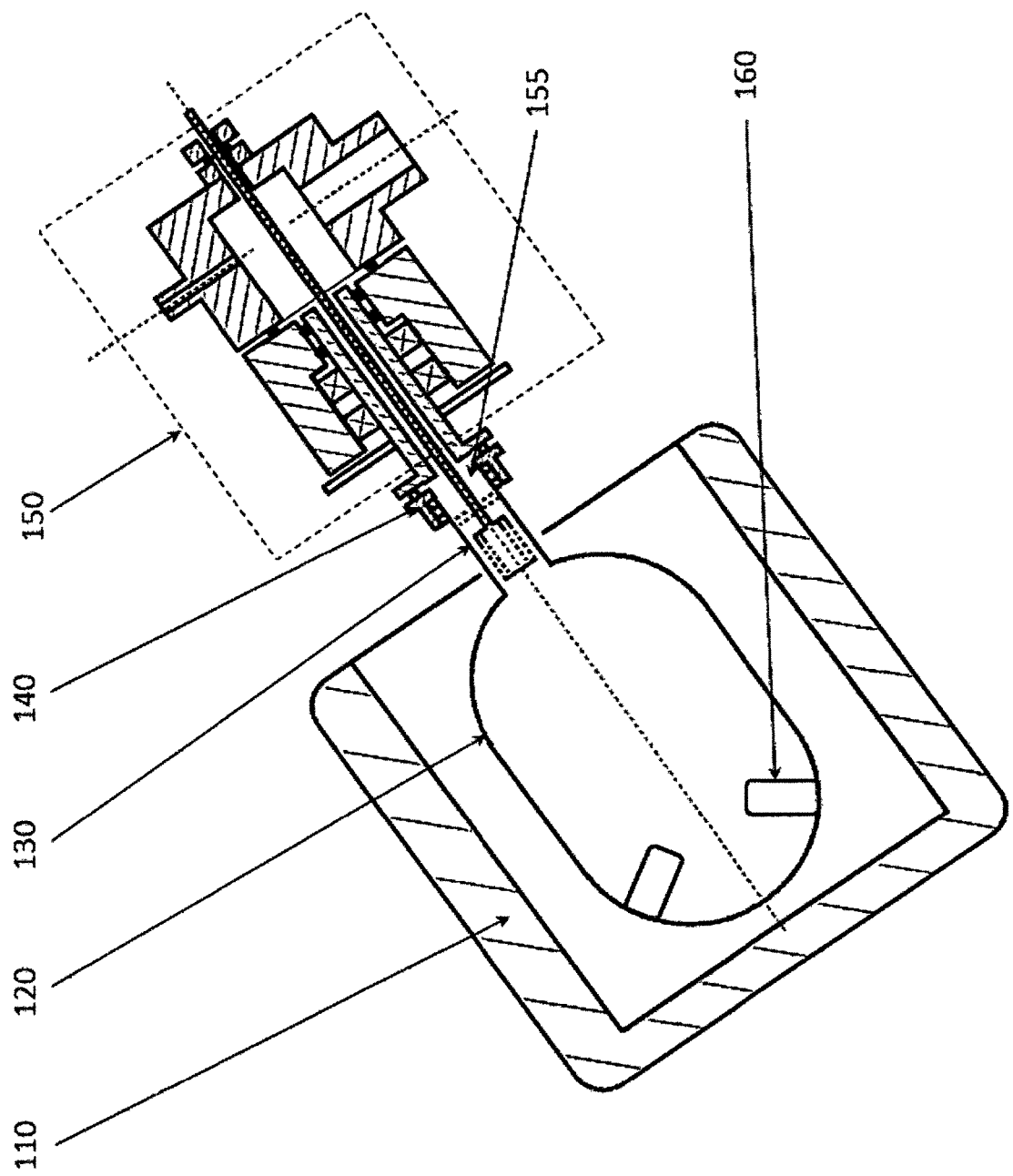
FIG. 1 is a schematic illustration of an exemplary rotary ALD chamber with tilted rotation axis according to an embodiment of the present invention.

It is to be understood that the appended drawings and the exemplary embodiments hereafter illustrate only typical embodiments of this invention and are therefore not to be considered limiting of its scope, as the invention may admit to other equally effective embodiments.

In one aspect of the embodiments of this invention, a rotary vessel is used to hold powders, and the powders are agitated by the rotary movement so as to improve the efficacy of "precursor-exposure" and "purge" steps. In addition, instead of relying on using porous filtering to confine the powders within the chamber, mechanism is provided so that the gravity of the powders can be employed to confine the powders within the chamber as gravity tends to pull the powders down to the bottom of the chamber. To facilitate this mechanism and prevent powders from being carried by gas flow and entering the pumping port, the ALD chamber shall be configured in a way so that the opening of the ALD chamber (which is the pumping port of the ALD chamber) is high enough compared to the "maximum height that most powders can reach". By doing so, most powders, although agitated, cannot reach the height of the pumping port because of the tendency of being pulled back to the bottom by gravity, thereby eliminating their chance of being blown away by gas flow and entering the pumping port. In another word, the "distance between the pumping port and the lowest point of the chamber (say, the bottom of the chamber)" should be configured to be as large as possible.

One strategy of achieving the above chamber configuration is to keep using a horizontally rotating cylinder, but increase the diameter of the rotating cylinder, and reduce the diameter of the pumping port that is positioned at the center of the side. In general, for a rotating chamber, it is convenient to center the pumping port at the rotation axis, otherwise the pumping port will be moving up and down when the chamber is rotating, making it hard to connect this moving pumping port to the stationary main pumping line. Therefore, the pumping port should be centered at the rotation axis, which will be the center of the flat side(s) of the cylindrical chamber. For this reason, increasing the diameter of the rotating cylinder will increase the "distance between pumping port and the lowest point of the chamber", reducing the chance of blowing powders into the pumping port. However, the disadvantage of this strategy is that the chamber cannot rotate too fast. If the chamber rotates too fast, powders will be dragged by the rotary movement to the top of the horizontally rotating chamber, thereby the "maximum height that most powders can reach" will be above the position of pumping port, destroying the mechanism of using gravity to confine the powders.

A better strategy in our embodiment is to use a tilted rotary cylinder, where the cylinder is tilted instead of positioned horizontally, and the cylinder rotates along its tilted axis. This strategy is developed based on the following facts: 1) a horizontally rotating chamber can efficiently agitate the powders in it, especially it can continuously pull out the powders buried in the bottom and bring these powders to the top, so that all powders can be easily exposed to ALD conditions. However, this horizontally rotating cylinder cannot efficiently confine the powders within the cylinder because the powders may be dragged by rotary movement to a level higher than the pumping port; 2) a vertically positioned cylinder with a pumping port positioned at the center of its top can efficiently confine the powders within the cylinder by gravity because it facilitates maximum "distance between the pumping port and the lowest point of the chamber". However, the rotation of such a vertically positioned cylinder cannot efficiently agitate the powder because in this case the powders will simply stay at the bottom and rotate together with the cylinder at the same speed. To take the advantages of both so as to agitate the powders by rotation and at the same time efficiently confine the powder with the chamber, the cylinder shall be positioned in between of "vertical" and "lateral", which means, the cylinder shall be tilted and rotate along its tilted axis. Therefore, in the embodiments of this strategy, a tilted chamber is used to hold the powders, the tilted chamber can rotate along its tilted axis, and the pumping port can be positioned at the center of the upper end of the vessel, which is on the rotary axis. The tilted chamber can be a round cylinder, or a cylinder with square base, or a cylinder with hexagonal base, or a cylinder with other polygonal base. The tilted chamber can also be a vessel in other shapes. In the following descriptions, this approach will be illustrated in more details.

In another aspect of the embodiments of this invention, to reduce the maximum height that powders can reach, the agitation of powders caused by gas flow, especially by the gas flow during pulsed precursor introduction and the intermittent purge/pump actions, must be minimized. To minimize the agitation caused by gas flow during pulsed precursor introduction, the configuration of the gas injection port must be carefully designed. A "gas flow diffuser" can be installed at the gas injection port to slow down the gas flow velocity and enable the gases to enter the ALD chamber in a smooth and gentle manner. Examples of such a device can be but not limited to a porous cylinder, or multi-shelled cylinder with fine pores which can break up the main stream gas flow into numerous small and smooth streams.

Besides the use of such a "gas flow diffuser", the mode of introducing precursor gases can also be carefully controlled (e.g., using a computer or controller 300). For example, the valve controlling precursor dosage can be opened briefly so that each time there is only a small amount of precursor gas introduced to the ALD chamber, and the amount is small enough so that it won't cause a big agitation of the powders. And for each precursor exposure step, the valve can be opened briefly for multiple times to provide enough precursors for the exposure.

To minimize the agitation caused by purging/pumping actions, the way of pumping must be carefully designed. In general, when the gas pressure is high, the agitation caused by gas flow will be large; when the gas pressure is low, the agitation caused by the gas flow will be small. Therefore, it will be advantageous if the pumping speed is low at the beginning when the gas pressure is relatively high in the ALD chamber; as gas pressure reduces, higher pumping speed can be used. For example, a valve with variable pumping speed can be used, or multiple pumping ports with various pumping speeds can be used either in the main pumping line or in the ALD chamber. In the following descriptions, an example of using two pumping ports in the main pumping line will be illustrated, where one pumping port has a small orifice for slow pumping at the beginning, and the other pumping port has a large opening for faster and more complete pumping.

In the third aspect of the embodiments of this invention, to enhance the powder agitation by rotary movement, blades, fins, or other similar structures 160 can be added to the inner side including the inner surface of the rotary vessel. In addition, besides a cylindrical vessel, the vessel can be made in other shapes, for example, polygonal cylinders, or non-cylindrical shape such as a flask with a long and narrow neck. In addition, the rotation speed can be non-constant, and the rotation can even be intermittent. To further enhance the powder agitation, small glass or ceramic beads or similar materials can be mixed with the powders during ALD. The small glass or ceramic beads can be in mm diameter, much larger than the size of powders, therefore can be easily separated by filtering (e.g. filtered by a filter with specific pore sizes) or precipitation (e.g. precipitation in liquid media as they have different precipitation speed from the fine powders) from powders after ALD deposition.

In the fourth aspect of the embodiments of this invention, in this tilted rotary powder-ALD system, the rotary chamber is designed to be of low-cost, and be connected to the main ALD system via fast connections such as KF flanges, so that the chamber part can be removed from the main system conveniently for easy replacement/exchange or cleaning. The "low-cost" and "easy to replace/exchange" features make it possible for users to have a series of ALD chambers so that each chamber can be assigned to one particular sample, thereby avoid inter-sample contaminations. The chamber can also be made to be "easy-to-clean". The feature of "easy-to-clean" makes it possible to rinse off any residual powders sticking on the chamber walls by using solvent such as ethanol, and re-collect these powders by vaporizing the solvent, thereby reduces the waste of powders on chamber walls. All these features make this ALD system advantageous for processing powder samples.

In the other aspect of the embodiments of this invention, a dual-chamber ALD apparatus is built up wherein one chamber can be used for wafer samples and the other chamber is a rotary chamber that can be used for powdered samples. The two chambers share the same pumping system and the same precursor system, Tilted Rotary ALD Chamber In this aspect of the embodiments, the main ALD chamber that holds the powdered samples; is a rotary vessel (depicted as 120 in FIG. 1, and later 120 also refers to the "ALD chamber" since this rotary vessel is exactly the chamber where ALD takes place), and the rotary vessel here is a tilted cylindrical glass vessel with a constricted neck. This ALD chamber 120 can be heated by an oven 110 as shown in FIG. 1. The constricted chamber neck 130 is open at the end, which serves as the pumping port of the chamber. This opening 155 also allows gas introduction to the ALD chamber 120. At the end of the chamber neck 130, there is a vacuum adaptor 140, of which one side has a cylindrical port that connects and supports the ALD chamber 120 with two o-rings, and the other side has a standard fast-connection flange (e.g, NW 25 as used in this example) that can be connected to unit 150 that delivers the rotary movement as well as facilitating the pumping and gas injection actions to the ALD chamber 120.

As a further improvement of the above embodiments, the ALD chamber can be a glass flask or even a commercially available glass flask, with either flat bottom or round bottom, and the flask should be able to be connected to the unit 150 that delivers rotation, pumping and gas injection actions, either by an adaptor like adaptor 140, or simply by direct connection if 150 is properly designed. By doing so, ALD chamber 120 can be conveniently removed from the main ALD system. Since the chamber is made of glass or stainless steel that are non-porous, the chamber is low-cost and easy-to-clean. It should be noted that, the description of these improvements, however, does not indicate that the ALD chamber has to be designed in this way. In fact, the ALD chamber 120 can be made of glass, stainless steel or other materials, the shape of the chamber can be round, polygonal cylinders or other forms of shapes. So, in the exemplary embodiments of this teaching, a rotatable vessel is used as the ALD chamber and the rotation can be made along a tilted axis. As a further improvement, the ALD chamber can be detached from the ALD system conveniently by using quick connections such as KF flange connections.

Unit 150 is a vacuum-tight enclosure that facilitates rotating, pumping and gas injection actions, connected to the main chamber 120 by flange coupling. An enlarged schematic of 150 is shown in FIG. 2

Figure 2:
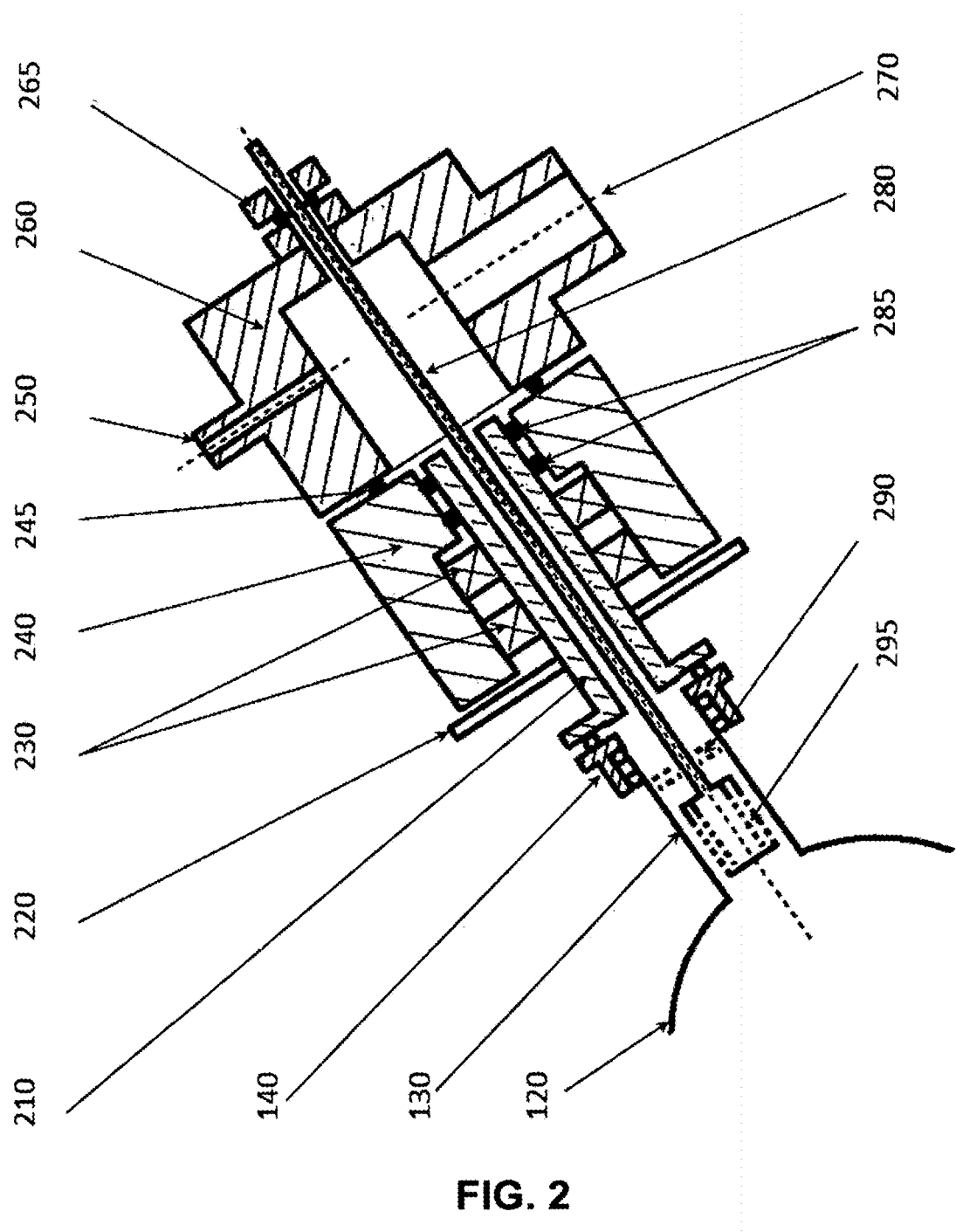
FIG. 2 is an enlarged schematic illustration of the configuration of the rotary mechanism, the gas injection port and the pumping ports of the exemplary rotary ALD chamber of FIG. 1.

In FIG. 2, 210 is a hollow shaft. At one end, it has a flange that fits the adaptor 140, for example, NW25 connection, or, this end can be made to be able to connect to the chamber neck 130 directly. Next to the flange, a chain sprocket 220 can be installed. The shaft can be supported by one or two or more bearings 230. At the other end of the shaft, one or more o-rings 285 can be used to seal the gap between shaft and the bearing house 240. The bearing house 240 has a stepped hole. In one step of the hole, the diameter fits the outer diameter of the bearing(s); in another step of the hole, the diameter satisfies the compression sealing of the o-rings 285. The two holes are concentric. The main ALD chamber 120 can be coupled to the shaft 210 and supported by the shaft if the main ALD chamber is not heavy, otherwise additional support can be added to support the main ALD chamber 120. The rotation of shaft 210 can be facilitated by chain driving through the chain sprocket 220 by another sprocket connected to a motor. The sprocket 220 can be replaced with any other mechanism that drives the rotation of the shaft 210, for example, be replaced by a belt-driving mechanism. The speed and the timing of the rotary movement can be controlled by a computer program (e.g., using a computer or controller 300). The rotation of the shaft can enable the rotation of the main ALD chamber 120. So, in the exemplary embodiments of this teaching, a rotatable hollow shaft is used, with one end of the shaft vacuum-tightly connectable to the upper end of the main ALD chamber, enabling pumping and gas introduction actions for the main ALD chamber through the hollow shaft.

Another house 260, which is hollow inside, is connected to the bearing house 240. O-ring or other gaskets 245 can be used in between of the two houses to form vacuum-tight sealing. By doing so, the inner side of house 260, the inner side of the shaft 210, and the main ALD chamber 120 are all connected. House 260 can have at least three ports, for example, port 250, port 270 and port 265. Port 250 is an outlet that will be connected to a pumping line with relatively small pumping speed. Port 270 is an outlet that will be connected to a pumping line with relatively large pumping speed. In the pumping/purge step of a typical ALD process for powdered materials, port 250 will be opened at first, when a major portion of the gas in the ALD chamber is pumped away, port 270 will be opened for faster or more thorough pumping. The opening action of both ports can be facilitated by pneumatic valves, or electromagnetic valves, or other forms of valves that can be controlled by a program (e.g., using a computer or controller 300). Port 265 enables the insertion of a gas injection tube 280 that can introduce gas into the chamber. O-ring or other methods can be used to form vacuum-tight sealing between port 265 and the gas injection tube 280. Additional ports can be added to house 260 if needed. For example, a port that can be connected to a vacuum gauge to measure the vacuum value inside the house, or a port connected to a composition analyzer to analyze the composition of the species during ALD process. So, in the exemplary embodiments of this teaching, a unit with two pumping pathways is connected to the rotatable hollow shaft to enable the pumping and gas introduction actions to the ALD chamber, wherein the pumping speed can be controlled as needed (e.g., using a computer or controller 300).

The gas injection tube 280 brings precursors or/and carrier gases into the main ALD chamber 120. At the end of the tube 280, a device served as "gas flow diffuser" (295 in FIG. 2) is installed to slow down the speed of the gas flow or/and make the gas flow enter the ALD chamber 120 in a smooth and gentle manner, thereby prevents excessively vigorous agitation of the powders caused by the incoming gas flow. By doing so, the majority of the powdered samples inside chamber 120 will only be agitated by the gas flow in a moderate manner, and the majority of the powdered samples inside chamber 120 will not be carried by gas flow to a height exceeding the height of the end of the neck 130. The diffuser 295 shown in FIG. 2 is a device comprising two concentric thin-walled cylinder with small holes in each cylinder. Better results can be achieved (but not necessary) if the holes in the inner cylinder are not aligned to the holes in the outer cylinder. The diffuser can be made in other forms, for example, a single-walled, or multi-walled cylinder with small holes in each cylinder, or other porous devices, and they may not necessarily be in cylindrical shape. So, in the exemplary embodiments of this teaching, a device named as "gas flow diffuser" is used at the end of the gas injection tube to slow down the speed of the gas flow and make the gas flow enter the ALD chamber in a smooth and gentle manner.

The purpose of using gas flow diffuser is to reduce the powder agitation by rapid and sudden gas flow, to prevent the powders in the ALD chamber from flying around thus escaping from the ALD chamber and entering the pumping lines. The use of the gas flow diffuser may not be sufficient in some situations, for example, when error operation occurs. As a second protection that prevents powders from escaping from the ALD chamber during ALD, a screen 290 comprising many holes can be placed in a location above the diffuser 295, for example, above the diffuser 295 in the neck 130, and a screen here may also function to reduce the amount of precursors that diffuse into the hollow shaft or the house 260 during the precursor exposure step, which causes the waste of precursor. The holey screen 290 can have one layer, or multiple layers, and the screen or additional screens can also be placed in upper levels, for example, near the adaptor 140, or in the hollow shaft 210. The screen can be made of stainless steel, or Teflon, or other materials. So, in the exemplary embodiments of this teaching, one or more holey screens are used to further prevent powders from being blown or pumped away from the chamber.

Enhancing Rotary Agitation by Using Blades, Altering Rotation Speed, or Adding Beads For different samples, the rotation speed may need to be adjusted so as to achieve best agitation result. Some powdered samples do not have enough internal friction among powders or between powder and the chamber wall. The rotation of a smooth wall surface may not be able to bring sufficient dragging force to the powders to agitate the powders. Therefore, blades, fins, or other similar structures 160 can be added to the inner side of the rotary chamber 120, or the inner surface of the rotary chamber 120, on as to make it easy for the rotation movement to agitate the powders. For the same reason, the shape of the rotary chamber 120 can be carefully designed, for example, besides cylinders with round cross-sections, the vessels can be made in other shapes, for example, a 3-D shape with oval, or polygonal cylinders cross-sections.

The rotation movement can be continuous at a constant speed. For better agitation result, the rotation can be intermittent, the rotation speed can be changed from time to time purposely, and the rotation direction can also be changed from time to time. Using intermittent rotation or variable speed rotation (including reversing rotation direction), the chamber can be tilted to a high angle or even be positioned vertically.

To enhance the inter-particle interactions for better agitation, small glass or ceramic beads or similar materials can be mixed with the powders during ALD. Some powdered samples can be hard to be agitated by the tilted rotary chamber, especially for some nano- or micro sized powders.

To resolve this issue, small glass beads, ceramic beads or other similar materials that are easy to be agitated by the tilted rotary chamber can be added to the hard-to-agitate powders. The agitation of these small beads will enhance the agitation of the hard-to-agitate powders. After the ALD process, the beads can be filtered out by using mesh with small holes, or, the beads can be separated from the powder by precipitation in liquid media, as different particle will precipitate at different speed in a liquid media. For example, when processing 5 cubic centimeters of nanoporous carbon powders in this rotary ALD system, 0.1 cubic centimeter of about 1 mm diameter glass beads can be mixed with the carbon powder. After ALD, the mixture of carbon black and glass beads can be dispersed in ethanol solvent. Glass beads will precipitate to the bottom rapidly, while nanoporous powder will be dispersed in the solvent. By doing so, it is easy to separate carbon black and the glass beads, and the nanoporous carbon powder dispersed in solvent can be easily collected by vaporizing the solvent.

Tilted Rotary ALD System

Figure 3:
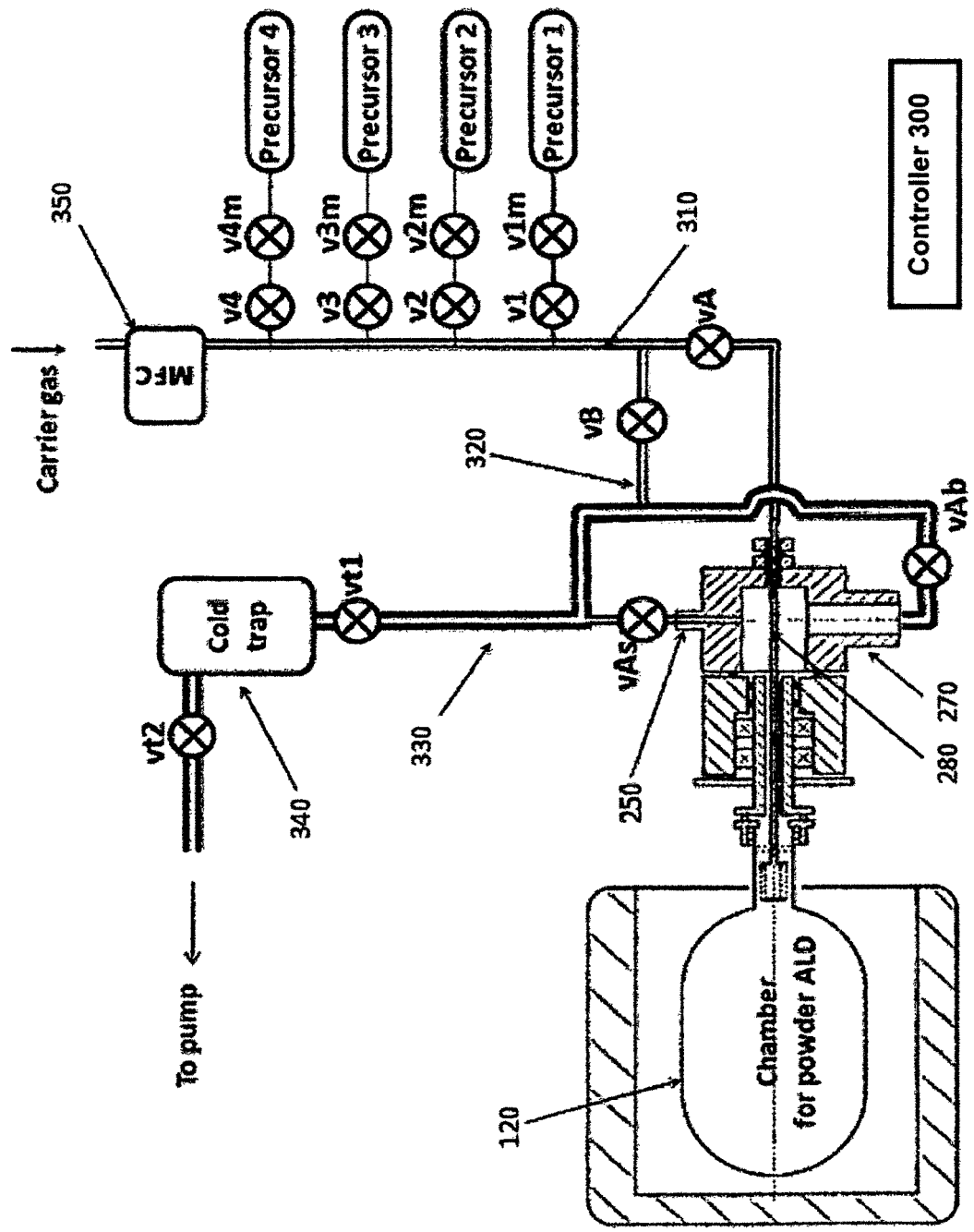
FIG. 3 is a schematic illustration of the gas line and pumping line configuration of an exemplary ALD system with a tilted rotary chamber axis according to an embodiment of the present invention.

FIG. 3 is a schematic illustration of the configuration of the ALD chamber, the gas lines, and the pumping lines for a typical rotary ALD system. Carrier gas can be introduced into the main gas line 310 through a mass flow controller MFC (shown as 350). Precursors 1-4 can be introduced into the main gas line 310 through automatic valves v1-v4 and manual valves v1m-v4m. Here we take a system with 4 precursors as an example. More precursors can be installed to the system. The main gas line 310 can be connected to the main pumping line 330 through valve vB, so that the gas line can be pumped when vA valve is closed, for example, to pump the main gas line during the reaction step when precursor is kept inside the ALD chamber to react with the sample. The main gas line can also be connected to the gas injection tube 280 through valve vA. The main pumping line 330 can be connected to the small pumping port 250 through valve vAs for slow and smooth pumping. The main pumping line 330 can also be connected to the large pumping port 270 through valve vAb for faster or more thorough pumping. In between of the main pumping line 330 and the pump, there is a cold trap 340. The cold trap can be used to trap pump oil vapor to improve the vacuum, or trap precursor vapors to protect the pump. The cold trap can be isolated by two valves: vt1 and vt2. Although not shown in the figure, one or more vacuum gauges can be installed in any proper locations as needed.

An ALD process in this rotary powder-ALD system may comprise the following major steps (e.g., controlled by a computer or controller 300):

1) Vent the ALD chamber 120 and load proper amount of powdered sample in the chamber 120; The venting may be done through gas injection tube 280.

2) Pre-pump the whole ALD system and heat the ALD chamber, which may include: a) pump the main gas line 310. Make sure pump is on, vt1, vt2 and vB are open, vA, vAb and vAs are closed, v1-v4 and v1m-v4m are closed; b) turn on the gas flow. High purity Ar or $N_2$ or other inert gases can be used as the carrier gas, and the mass flow controller MFC 350 can be turned on. The flow rate can be 1-5 sccm for small chamber such as a 250 ml chamber. Other flow rates can be used, depending on the size of the chamber and the nature of the powders; c) pump the ALD chamber 120. Open valve vAs first for slower pumping, and keep it pumping for some time until a major part of the gas in the chamber is pumped away, say, keep it pumping for 10 minutes, then, open valve vAb for faster pumping and leave it open until the ALD cycles start; d) turn on the oven to heat the chamber at certain temperature; e) turn on the motor to drive the rotation of the ALD chamber.

3) Start ALD cycles. In this exemplary system, there are 4 precursors installed. Here we take an ALD process that needs precursor 1 and precursor 2 as the example although less or more precursors can be used in an ALD process. In this exemplary ALD process, as a preparation, we may: open the corresponding precursor valves, for example, open v1m and v2m so as to use precursor 1 and precursor 2 as the ALD precursors, but keep the automatic valves v1-v4 valves closed; leave vt1, vt2 and vB open, close vA, vAb, vAs and v1-v4. Make sure carrier gas flow is on. To start the ALD cycles, we may: a) close vB, and open v1 and vA, for a proper duration time, say, $t_{dose\ 1}$, so that precursor can enter the ALD chamber; b) close v1 and vA and open vB for a proper duration time, say, $t_{rxn\ 1}$, to allow precursor 1 to react with the sample surface for certain time; c) open vAs for certain time, say, $t_{slow\ pump\ 1}$, so as to pump away most gases in the ALD chamber, vA may or may not be opened; d) open vAb for certain time, say, $t_{large\ pump\ 1}$, so as to more thoroughly remove residual gases. vA may or may not be opened. After that, close vAb and vAs; e) close vB, open v2 and vA, for a proper duration time, say, $t_{dose\ 2}$, so that precursor 2 can enter the ALD chamber; f) close v2 and vA, open vB for a proper duration time, say, $t_{rxn\ 2}$, to allow precursor 2 to react with the sample surface for certain time; g) open vAs for certain time, say, $t_{slow\ pump\ 2}$, so as to pump away most gases in the ALD chamber. vA may or may not be opened; h) open vAb for certain time, say, $t_{large\ pump\ 2}$, so as to more thoroughly remove residual gases. vA may or may not be opened; i) repeat steps a) to h) for needed number of cycles to achieve needed coating thickness.

4) When ALD is done, leave vAs, vAb and vB open to keep pumping and purging the whole ALD system until the venting is needed to exchange sample. vA may or may not be opened. To vent the ALD chamber, one way is to open vA and increase gas flow rate so that gas can enter the ALD chamber.

Dual-Chamber ALD System with Tilted Variable Speed Rotary Chamber

For research and development purpose, besides powdered or small fibered samples, other bulk samples may be needed, for example, the wafer samples.

With small modification thereby small additional cost, the above tilted rotary ALD system can be upgraded into a dual-chamber ALD system, comprising not only the rotary chamber, but also a regular stationary chamber for bulk samples such as Si wafers.

Figure 4:
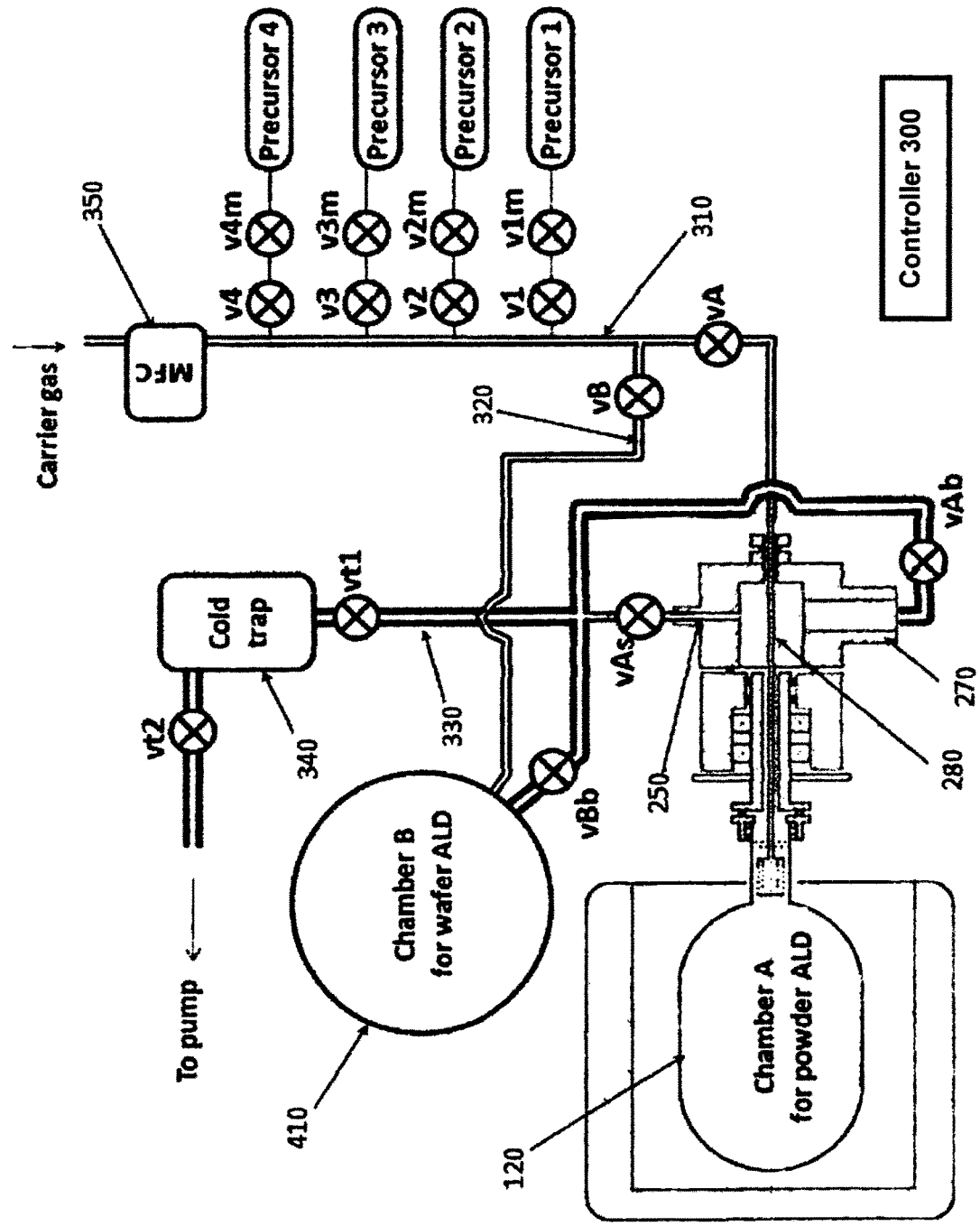
FIG. 4 is a schematic illustration of the gas line and pumping line configuration of an exemplary dual-chamber ALD system with one tilted rotary chamber according to an embodiment of the present invention.

FIG. 4 is the schematic illustration of the configuration of the said dual-chamber ALD system. in this system, additional ALD chamber 410, say, chamber B, is added. A valve vBb is used to connect the chamber B 410 to the main pumping line 330, and the gas line after valve vB, shown as 320 in FIG. 3, is not connected directly to the main pumping line 330 anymore. Instead, 320 is connected to the chamber B 410 first, so that it can bring gases to chamber B for ALD. Through chamber 410, and valve vBb, line 320 can be connected to the main pumping line. The shape and configuration of chamber B is not specified here, as the current exemplary embodiments can work for many kinds of ALD chamber configurations.

This system enables two ALD modes: 1) powder ALD mode for which ALD takes place only in chamber A; 2) wafer ALD mode for which ALD takes place only in chamber B.

To operate this dual chamber ALD system in powder ALD mode to process sample(s) in chamber A 120, simply leave valve vBb open all the time and run ALD by following the procedure for "tilted rotary ALD system" as shown in paragraphs [0055] to [0058]. This doesn't exclude other similar operations, for example, vBb can be opened whenever vB is open, and ALD can operated by following the procedure for "tilted rotary ALD system" as shown in paragraphs [0055] to [0058].

To operate this dual chamber ALD system in ALD mode for sample(s) in chamber B, simply close vA, vAb, vAs all the time, but this doesn't exclude other similar operations, for example, open vA and vAb whenever vB is closed in order to pump the gas line at that moment.

As an example, an ALD process for chamber B may comprise the following steps (e.g., controlled by a computer or controller 300):

1) Vent the ALD chamber B 410 and load the sample. The venting may be done through mass flow controller MFC 350 and valve vB.

2) Pre-pump the whole ALD system and heat the ALD chamber, which may include: a) pump the main gas line 310. Make sure pump is on, vt1, vt2 and vB are open, vA, vAb and vAs are closed, v1-v4 and v1m-v4m are closed; b) turn on the gas flow. High purity Ar or $N_2$ or other inert gases can be used as the carrier gas, and the mass flow controller MFC 350 can be turned on; c) pump the ALD chamber 410 by opening vBb; d) turn on the heater to heat the sample in chamber B at certain temperature.

3) Start ALD cycles. As a preparation, we may: open the corresponding precursor valves, for example, open v1m and v2m so as to use precursor 1 and precursor 2 as the ALD precursors, but keep the automatic valves v1-v4 valves closed; leave vt1, vt2, vB and vBb open, close v1-v4. vA, vAb and vAs may or may not open at this moment. Make sure carrier gas flow is on. To start the ALD cycles, we may: a) Make sure vA is closed, then close vBb, open v1 and vB for a proper duration time, say, $t_{dose\ 1b}$, so that precursor 1 can enter the ALD chamber B; b) close v1 and vB for a proper duration time, say, $t_{rxn\ 1b}$, to allow precursor 1 to react with the sample surface for certain time. vA, vAb and vAs may or may not open at this moment; c) open vBb and vB for certain time, say, $t_{pump\ 1b}$, so as to pump away excessive gases in the ALD chamber; d) Make sure vA is closed, then close vBb, open v2 and vB, for a proper duration time, say, $t_{dose\ 2b}$, so that precursor 2 can enter the ALD chamber; e) close v2 and vB for a proper duration time, say, $t_{rxn\ 2}$, to allow precursor 2 to react with the sample surface for certain time. vA, vAb and vAs may or may not open at this moment; f) open vBb and vB for certain time, say, $t_{pump\ 2b}$, so as to pump away excessive gases in the ALD chamber B. g) repeat steps a) to 0 for needed number of cycles to achieve needed coating thickness.

4) when ALD is done, leave vB, vBb open to keep pumping and purging the whole ALD system until the venting is needed to exchange sample. To vent the ALD chamber, one way is to open vB and increase gas flow rate so that gas can enter the ALD chamber.

Figure 5A:
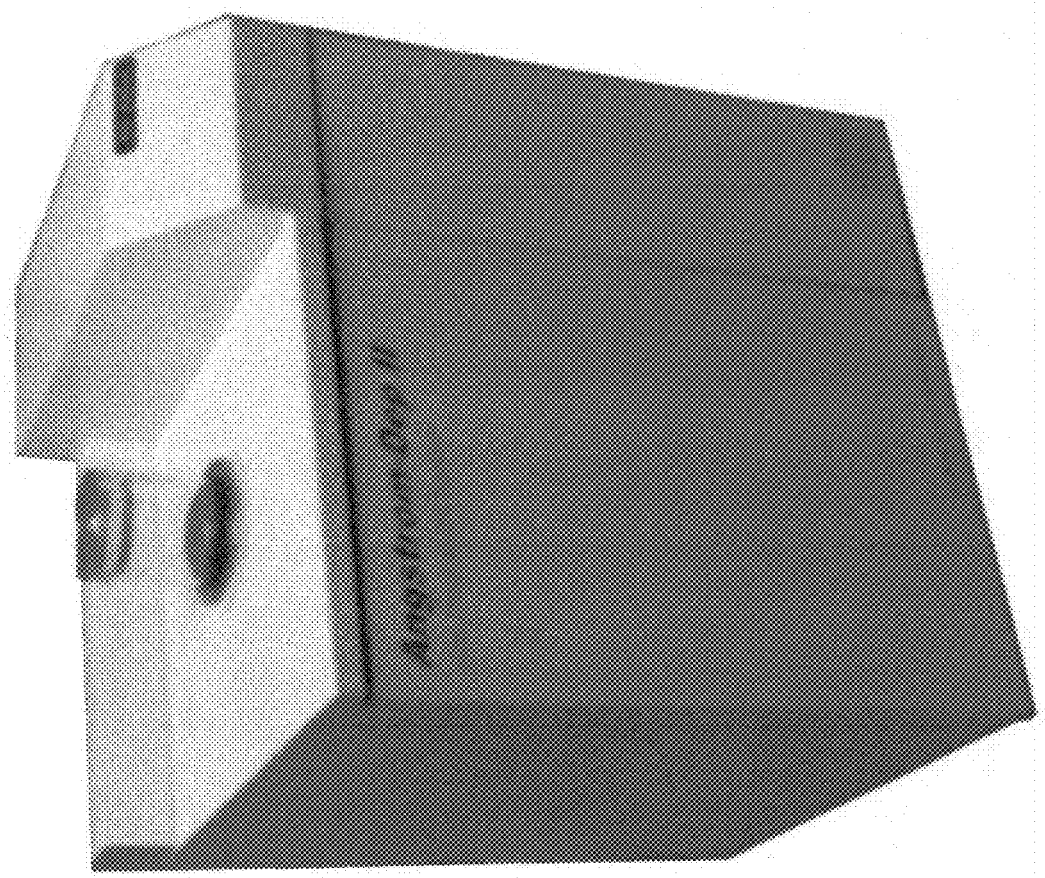
FIG. 5A is a photograph of an exemplary dual-chamber ALD system according to an embodiment of the present invention.
Figure 5B:
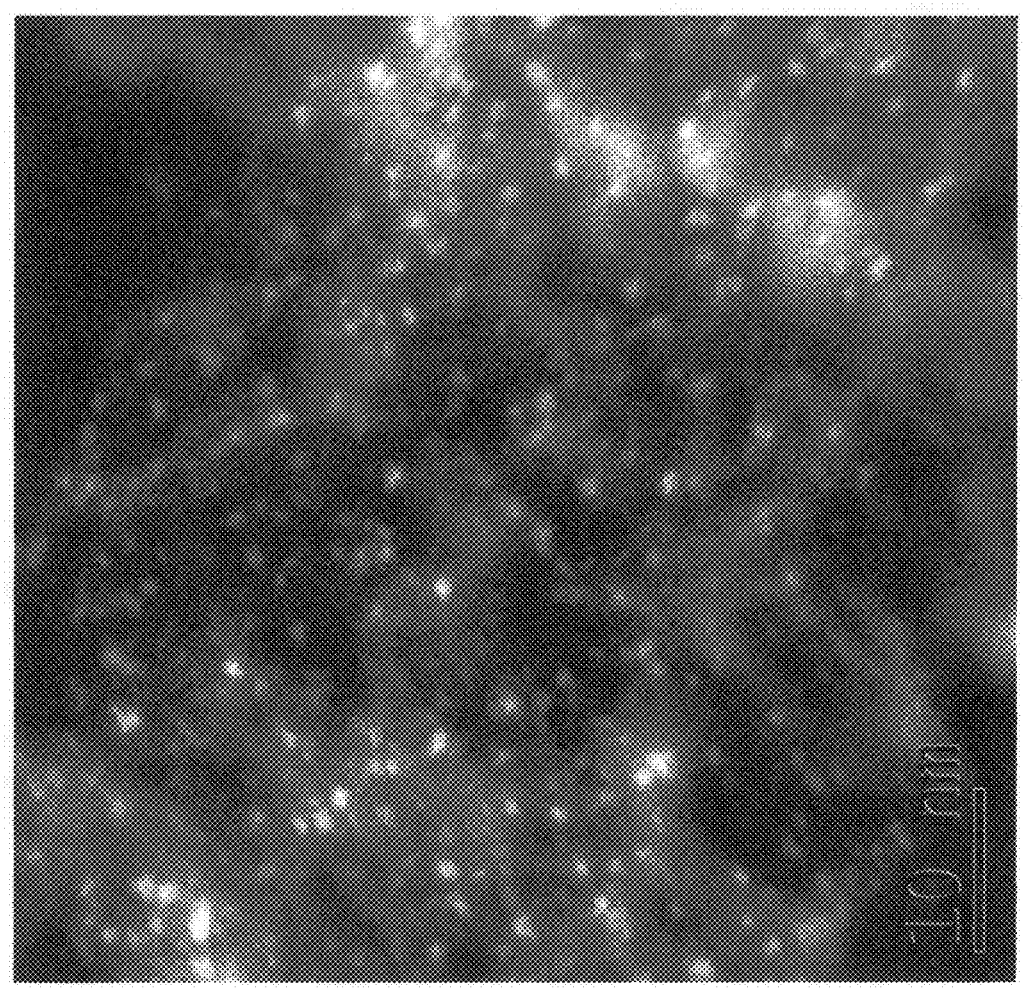
FIG. 5B a photograph of a scanning TEM image of an exemplary result of Pt ALD on porous carbon powders processed using an exemplary tilted rotary ALD chamber of the exemplary dual-chamber ALD system of FIG. 5A.
Figure 5C:
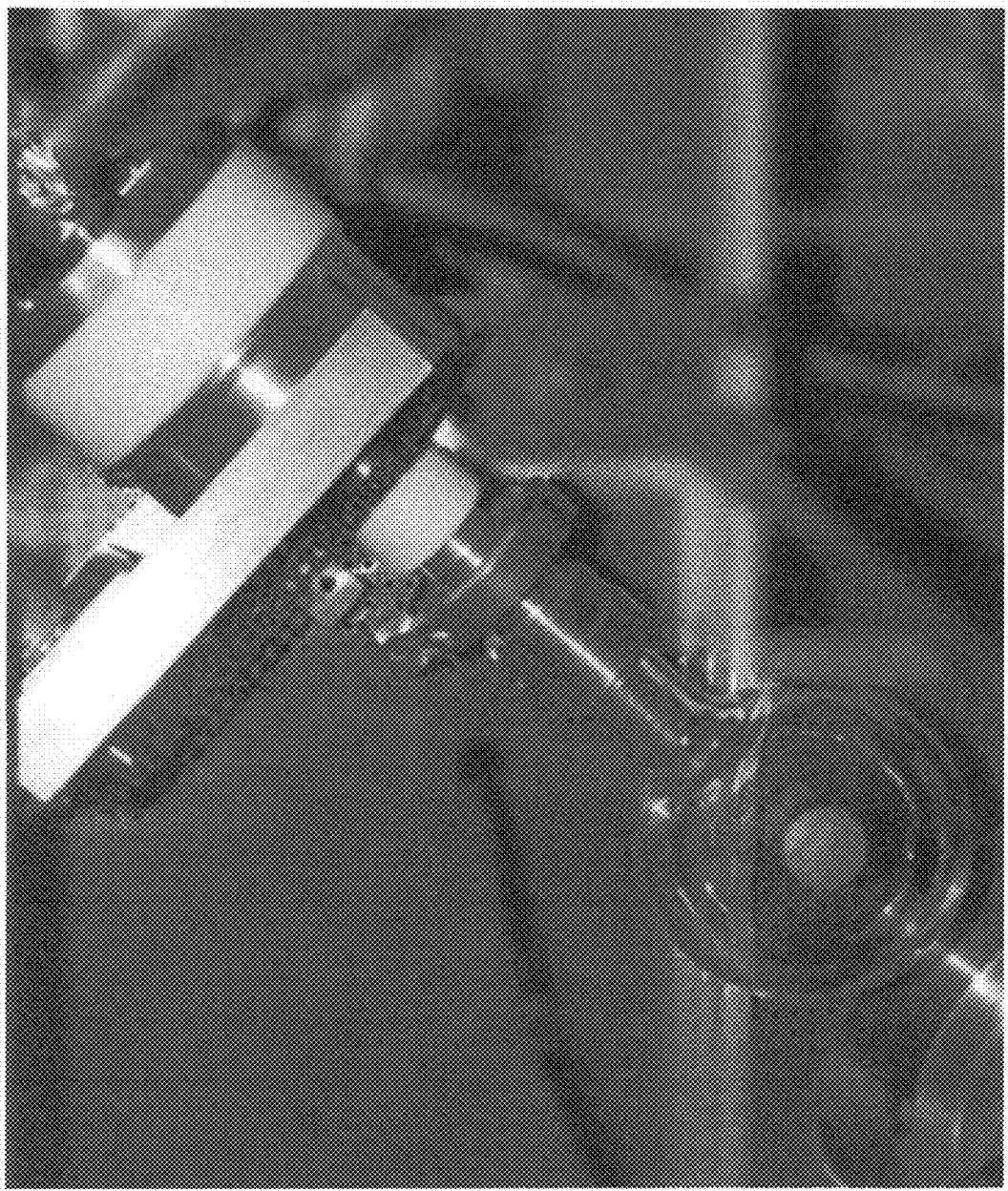
FIG. 5C is a photograph of an exemplary tilted rotary ALD chamber located inside the door of the exemplary dual-chamber ALD system of FIG. 5A.

FIG. 5A is a photograph of an example of such a dual-chamber ALD system. A regular wafer ALD chamber (e.g., chamber B of FIG. 4) is positioned on the top of the system (FIG. 5A), and a tilted rotary ALD chamber (e.g., chamber A of FIG. 4) is positioned behind the front door of the system (e.g., FIG. 5C). The heater and heat shield for chamber B are not shown in the photograph of FIG. 5A. FIG. 5B shows photograph of a scanning TEM image of an exemplary result of Pt ALD on porous carbon powders processed using an exemplary tilted rotary ALD chamber of the exemplary dual-chamber ALD system of FIG. 5A.

Although the forgoing invention has been described in terms of certain preferred embodiments, other embodiments will become apparent to those of ordinary skill in the art in view of the disclosure herein. Accordingly, it is noted that the above specifications and examples be considered as exemplary only, not a limiting of the scope.

What is claimed includes:

1. An apparatus for modifying surfaces of or coating powdered or small fibrous materials using multiple alternating exposure and purge steps, the apparatus comprising:
   a. a rotary vessel comprising:
      a chamber configured to accommodate the powdered or small fibrous materials,
      a chamber rotation axis,
      at least one chamber opening at one end of the chamber, aligned with the chamber rotation axis and configured to facilitate fluid communication to and from the chamber;
   b. a housing comprising:
      a hollow shaft including:
         a shaft rotation axis orientated at an angle ranging from about 15° to about 89° from the horizon,
         an end configured to releasably couple to the at least one chamber opening and substantially aligned the chamber rotation axis and the shaft rotation axis, and
         configured to deliver rotary motion to the chamber when releasably coupled to the at least one chamber opening; and
      at least one port configured to facilitate fluid communication between the chamber and a pumping system during a portion of an alternating purge step so as to remove un-reacted precursor and reaction byproducts from the chamber while leaving a chemisorbed layer or coating layer on the surfaces of the powdered or small fibrous materials; and
   c. a tube
      having a first end extending into the at least one chamber opening,
      having a second end extending through the housing, and
      a portion, between the first and second ends, at least partially within the hollow shaft,
      defining an annular passage within the housing, and
      configured to facilitate fluid communication during an exposure step between a precursor system and the chamber so as to introduce a precursor through the tube into the chamber to expose surfaces of the powdered or small fibrous materials to the precursor;
   d. the precursor system comprising:
      a main gas line in fluid communication with the tube at a downstream end of the main gas line, and including a main gas valve between the main gas line and the tube,
      an inert gas source at an upstream end of the main gas line,
      at least a first precursor source and a second precursor source in fluid communication with the main gas line between the upstream and downstream ends of the main gas line,
      a first precursor valve between the first precursor source and the main gas line, and
      a second precursor valve between the second precursor source and the main gas line;

e. the pumping system comprising:
a main pumping line
in fluid communication, at an upstream end of the pumping line, with the annular passage, and
at least one pumping valve between the upstream end of the pumping line the at least one port, and
the pumping system configured to remove un-reacted precursor and reaction byproducts from the chamber while leaving a chemisorbed layer or coating layer on the surfaces of the powdered or small fibrous materials;
f. a gas line
configured to provide fluid communication between the main gas line and the main pumping line and
including a valve on the gas line configured to facilitate the fluid communication between the main gas line and the main pumping line; and
g. a controller configured to:
g. i. control a sequence of the opening and closing of the at least one pumping valve, the main gas valve, the valve on the gas line, the first precursor valve and the second precursor valve during a cycle, the sequence comprising:
g. i. (1) a first precursor exposure step comprising:
closing the valve on the gas line,
opening the main gas valve, and
opening the first precursor valve
to flow the first precursor from the first precursor source into the chamber for a first predetermined dose time;
g. i. (2) a first precursor reaction step comprising:
closing the first precursor valve,
opening the main gas valve, and
opening the valve on the gas line
for a first predetermined reaction time to allow the first precursor to form a chemisorbed layer on the surfaces of the powdered or small fibrous materials;
g. i. (3) a first precursor purge step comprising:
opening the at least one pumping valve for at least one first predetermined purging time to remove un-reacted precursor and any reaction byproducts from the chamber at a first flow rate; and
g. i. (4) a second precursor exposure step comprising:
closing the valve on the gas line,
opening the main gas valve, and
opening the second precursor valve
to flow the second precursor from the second precursor source into the chamber for a second predetermined dose time;
g. i. (5) a second precursor reaction step comprising:
closing the second precursor valve,
opening the main gas valve, and
opening the valve on the gas line
for a second predetermined reaction time to allow the second precursor to react with the chemisorbed layer on the surfaces of the powdered or small fibrous materials; and
g. i. (6) a second precursor purge step comprising:
opening the at least one pumping valve for at least one second predetermined purging time to remove un-reacted precursor and reaction byproducts from the chamber at a second flow rate, and
the controller configured to:
g. ii. perform a predetermined number of cycles of the sequence to achieve a predetermined coating thickness.

2. The apparatus of claim 1, further comprising extruding structures on an inner surface of the chamber configured to agitate the powdered or small fibrous materials during the rotary motion of the chamber.

3. The apparatus of claim 2, wherein the extruding structures include one or more blades, short sticks and fins.

4. The apparatus of claim 1, wherein a cross-section of the chamber perpendicular to the chamber rotation axis comprises a noncircular cross-section.

5. The apparatus of claim 4, wherein the noncircular cross-section of the chamber perpendicular to the chamber rotation axis comprises an oval cross-section, triangular cross-section, or polygonal cross-section.

6. The apparatus of claim 1, wherein:
b. the housing comprises:
the at least one port configured to facilitate fluid communication between the chamber and the pumping system during a portion of an alternating purge step at one flow rate so as to remove un-reacted precursor and reaction byproducts from the chamber while leaving a chemisorbed layer or coating layer on the surfaces of the powdered or small fibrous materials, and
at least one additional port configured to facilitate fluid communication between the chamber and a pumping system during an another portion of an alternating purge step at another flow rate so as to remove un-reacted precursor and reaction byproducts from the chamber while leaving a chemisorbed layer or coating layer on the surfaces of the powdered or small fibrous materials;
e. the pumping system comprises:
the at least one pumping valve between the upstream end of the pumping line the at least one port, and
at least one additional pumping valve between the upstream end of the pumping line and the at least one additional port; and
g. the controller is configured to:
g. i. control the sequence comprising:
g. i. (3) a first precursor purge step comprises:
opening the at least one pumping valve for at least one first predetermined purging time to remove un-reacted precursor and any reaction byproducts from the chamber at the first flow rate, and
opening the at least one additional pumping valve for at least one additional first predetermined purging time to remove un-reacted precursor and reaction byproducts from the chamber at a third flow rate greater than the first flow rate, and
g. i. (6) a second precursor purge step comprises:
opening the at least one pumping valve for at least one second predetermined purging time to remove un-reacted precursor and reaction byproducts from the chamber at the second flow rate, and
opening the at least one pumping valve for at least one additional second predetermined purging time to remove un-reacted precursor and reaction byproducts from the chamber at a fourth flow rate greater than the second flow rate.

7. The apparatus of claim 6, wherein:
g. the controller is configured to:
g. i. control the sequence comprising:
g. i. (3). a first precursor purge step further comprising:
closing the main gas valve; and
g. i. (6). a second precursor purge step further comprising:
closing the main gas valve.

8. The apparatus of claim 6, wherein:
g. the controller is configured to:
  g. i. control the sequence comprising:
    g. i. (1) the first precursor exposure step further comprising:
      closing the at least one pumping valve and
      closing the at least one additional pumping valve; and
    g. i. (4) the second precursor exposure step further comprising:
      closing the at least one pumping valve and
      closing the at least one additional pumping valve.
9. The apparatus of claim 1, further comprising:
h. two or more pathways between the chamber and the pumping system, wherein:
b. the housing further comprises:
  at least one additional port configured to facilitate fluid communication between the chamber and a pumping system during another portion of the alternating purge step at a second flow rate so as to remove un-reacted precursor and reaction byproducts from the chamber while leaving a chemisorbed layer or coating layer on the surfaces of the powdered or small fibrous materials;
e. the pumping system further comprises:
  at least one additional pumping valve between the upstream end of the pumping line and the at least one additional port;
  e. i. a first pathway comprises:
    the at least one port,
    the at least one pumping valve, and
    a first pathway line between the upstream end of the pumping line and the at least one port; and
  e. ii. a second pathway comprises:
    the at least one additional port,
    the at least one additional pumping valve, and
    a second pathway line between the upstream end of the pumping line and the at least one additional port; and
g. the controller is configured to:
  g. i. control the sequence comprising:
    g. i. (3) the first precursor purge step comprising:
      opening the at least one additional pumping valve for at least one additional first predetermined purging time to remove un-reacted precursor and reaction byproducts from the chamber at a third flow rate greater than the first flow rate;
    or
    g. i. (6) a second precursor purge step further comprising:
      opening the at least one additional pumping valve for at least one additional second predetermined purging time to remove un-reacted precursor and reaction byproducts from the chamber at a fourth flow rate greater than the second flow rate;
    or
    g. i. (3) the first precursor purge step comprising:
      opening the at least one additional pumping valve for at least one additional first predetermined purging time to remove un-reacted precursor and reaction byproducts from the chamber at a third flow rate greater than the first flow rate; and
    g. i. (6) a second precursor purge step further comprising:
      opening the at least one additional pumping valve for at least one additional second predetermined purging time to remove un-reacted precursor and reaction byproducts from the chamber at a fourth flow rate greater than the second flow rate.
10. The apparatus of claim 1, wherein:
g. the controller is configured to:
  g. i. control the sequence comprising:
    g. i. (3). a first precursor purge step further comprising:
      closing the main gas valve; and
    g. i. (6). a second precursor purge step further comprising:
      closing the main gas valve.
11. The apparatus of claim 1, wherein:
g. the controller is configured to:
  g. i. control the sequence comprising:
    g. i. (1) the first precursor exposure step further comprising:
      closing the at least one pumping valve;
    g. i. (4) the second precursor exposure step further comprising:
      closing the at least one pumping valve.
12. The apparatus of claim 1, wherein:
g. the controller is further configured to:
  g. iii. control a preparation step comprising:
    g. iii. (1) opening the valve on the gas line,
    g. iii. (2) either:
      closing the at least one pumping valve
    or
      closing at least one additional pumping valve,
    g. iii. (3) closing the first precursor valve,
    g. iii. (4) closing second precursor valve and
    g. iii. (6) closing the main gas line to pump the main gas line through the main pumping line via the gas line;
    g. iii. (7) flowing inert gas from the inert gas source,
    g. iii. (8) closing the valve on the gas line and
    g. iii. (9) opening the main gas valve to flow the inert gas into the chamber;
    g. iii. (10) either:
      opening the at least one pumping valve
    or
      opening the at least one additional pumping valve,
    g. iii. (11) opening the valve on the gas line and
    g. iii. (12) closing the main gas valve to pump the inert gas from the chamber to the main pumping line, and
    g. iii. (13) begin delivering rotary motion to the chamber.
13. The apparatus of claim 1, wherein:
g. the controller is further configured to:
  g. iii. control a preparation step comprising:
    g. iii. (1) flowing inert gas from the inert gas source,
    g. iii. (2) closing the valve on the gas line,
    g. iii. (3) opening the main gas valve to flow the inert gas into the chamber followed by:
    g. iii. (4) either:
      opening the at least one pumping valve
    or
      opening the at least one additional pumping valve,
    g. iii. (5) opening the valve on the gas line and
    g. iii. (6) closing the main gas valve
      to pump the inert gas from the chamber to the main pumping line; and
    g. iii. (7) begin delivering rotary motion to the chamber.

14. An apparatus for modifying surfaces of or coating powdered or small fibrous materials using multiple alternating exposure and purge steps, the apparatus comprising:
   a. a rotary vessel comprising:
      a chamber configured to accommodate the powdered or small fibrous materials,
      a chamber rotation axis,
      at least one chamber opening at one end of the chamber, aligned with the chamber rotation axis and configured to facilitate fluid communication to and from the chamber;
   b. a rotation facilitating unit including:
      a pumping portion including
         at least one pumping port configured to facilitate a first removal speed of un-reacted precursor and reaction byproducts from the chamber and
         at least one additional port configured to facilitate a second removal speed of un-reacted precursor and reaction byproducts from the chamber, and
         the second removal speed greater than the first removal speed;
      a hollow shaft including:
         a shaft rotation axis,
         an end of the hollow shaft configured to releasably couple to the at least one chamber opening and substantially aligned the chamber rotation axis and the shaft rotation axis, and
         a drive mechanism configured to deliver rotary motion to the chamber when releasably coupled to the at least one chamber opening;
      a shaft support portion configured to:
         facilitate rotation of the hollow shaft and
         support the hollow shaft at an orientation so that the shaft rotation axis comprises an angle ranging from about 15° to 89° from the horizon;
   c. a tube
      having an outlet end extending into the at least one chamber opening,
      having a second end extending beyond the pumping portion, and
      a portion, between the outlet end and second end, at least partially within the hollow shaft and the pumping portion defining annular passages between the hollow shaft and the tube and between the pumping portion and the tube,
      the tube configured to facilitate fluid communication during an exposure step between a precursor system and the chamber so as to introduce a precursor through the tube into the chamber to expose surfaces of the powdered or small fibrous materials to a precursor, and
      the annular passages configured to facilitate fluid communication between the chamber and a pumping system during an alternating purge step so as to remove un-reacted precursor and reaction byproducts from the chamber while leaving a chemisorbed layer or coating layer on the surfaces of the powdered or small fibrous materials; and
   d. the precursor system comprising:
      a main gas line in fluid communication with the tube at a downstream end of the main gas line,
      a main gas valve between the main gas line and the tube;
      an inert gas source at an upstream end of the main gas line
      at least a first precursor source in fluid communication with the main gas line between the upstream and downstream ends,
      at least a second precursor source in fluid communication with the main gas line between the upstream and downstream ends and
      a first precursor valve between the first precursor source and the main gas line, and
      a second precursor valve between the second precursor source and the main gas line;
   e. the pumping system:
      comprising a main pumping line
         a first pathway, at an upstream end of the pumping line, in fluid communication with the at least one pumping port and
         a second pathway, at the upstream end of the pumping line, in fluid communication with the at least one additional port,
      at least one pumping valve along the first pathway and between the pumping line and the at least one pumping port,
      at least one additional pumping valve along the second pathway and between the pumping line and the at least one additional port, and
      the pumping system configured to remove un-reacted precursor and reaction byproducts from the chamber at adjustable flow rates using one of more of the first pathway and the second while leaving a chemisorbed layer or coating layer on the surfaces of the powdered or small fibrous materials; and
   f. a controller configured to:
      f. i. control the opening and closing of the at least one pumping valve and the at least one additional pumping valve and the main gas valve, during a precursor purge step:
      f. i. (1) a sequence of a first precursor purge step comprising:
      either:
         opening the at least one pumping valve for at least one first predetermined purging time to remove un-reacted precursor and any reaction byproducts from the chamber at a first (1st) flow rate along the first pathway followed by
         opening the at least one additional pumping valve while maintaining open the at least one pumping valve for at least one additional first predetermined purging time to remove un-reacted precursor and reaction byproducts from the chamber along the first and second pathways at a third (3rd) flow rate greater than the first (1st) flow rate;
      or
         opening the at least one additional pumping valve for at least one first predetermined purging time to remove un-reacted precursor and reaction byproducts from the chamber along the second pathway at a fifth (5th) flow rate followed by
         opening the at least one pumping valve while maintaining open the at least one additional pumping valve for at least one additional first predetermined purging time to remove un-reacted precursor and any reaction byproducts from the chamber along the first and second pathways at a seventh (7th) flow rate greater than the fifth (5th) flow rate;
      or
         opening the at least one pumping valve for at least one first predetermined purging time to remove un-reacted precursor and any reaction byproducts from the chamber at a first (1st) flow rate along the first pathway followed by adjusting the at least one pumping valve for at least one first addition predetermined purging time to remove un-reacted precursor and any reaction byproducts from the chamber along the first pathway at a ninth (9th) flow rate greater than the first (1st) flow rate followed by opening the at least one additional pumping valve while maintaining open the at least one pumping valve for at least one further first predetermined purging time to remove un-reacted precursor and reaction byproducts from the chamber along the first and second pathways at a eleventh (11th) flow rate greater than the first (1st) flow rate and the ninth (9th) flow rate;

or opening the at least one pumping valve for at least one first predetermined purging time to remove un-reacted precursor and any reaction byproducts from the chamber at a first (1st) flow rate along the first pathway followed by opening the at least one additional pumping valve while at the same time closing the at least one pumping valve for at least one additional first predetermined purging time to remove un-reacted precursor and reaction byproducts from the chamber along the second pathway at a thirteenth (13th) flow rate greater than the first (1st) flow rate followed by opening the at least one pumping valve while maintaining open the at least one additional pumping valve and for at least one further first predetermined purging time to remove un-reacted precursor and reaction byproducts from the chamber along the first and second pathways at a fifteenth (15th) flow rate greater than the first (1st) flow rate and the thirteenth (13th) flow rate; and f. i. (2) a sequence of a second precursor purge step comprising:

either:

opening the at least one pumping valve for at least one first predetermined purging time to remove un-reacted precursor and any reaction byproducts from the chamber at a second (2nd) flow rate along the first pathway followed by opening the at least one additional pumping valve while maintaining open the at least one pumping valve for at least one additional first predetermined purging time to remove un-reacted precursor and reaction byproducts from the chamber along the first and second pathways at a fourth (4th) flow rate greater than the second (2nd) flow rate;

or opening the at least one additional pumping valve for at least one first predetermined purging time to remove un-reacted precursor and reaction byproducts from the chamber along the second pathway at a sixth (6th) flow rate followed by opening the at least one pumping valve while maintaining open the at least one additional pumping valve for at least one additional first predetermined purging time to remove un-reacted precursor and any reaction byproducts from the chamber along the first and second pathways at a eight (8th) flow rate greater than the sixth (6th) flow rate;

or opening the at least one pumping valve for at least one first predetermined purging time to remove un-reacted precursor and any reaction byproducts from the chamber at a second (2nd) flow rate along the first pathway followed by adjusting the at least one pumping valve for at least one first addition predetermined purging time to remove un-reacted precursor and any reaction byproducts from the chamber along the first pathway at a tenth (10th) flow rate greater than the second (2nd) flow rate followed by opening the at least one additional pumping valve while maintaining open the at least one pumping valve for at least one further first predetermined purging time to remove un-reacted precursor and reaction byproducts from the chamber along the first and second pathways at a twelfth (12th) flow rate greater than the second (2nd) flow rate and the tenth (10th) flow rate;

or opening the at least one pumping valve for at least one first predetermined purging time to remove un-reacted precursor and any reaction byproducts from the chamber at a second (2nd) flow rate along the first pathway followed by opening the at least one additional pumping valve while at the same time closing the at least one pumping valve for at least one additional first predetermined purging time to remove un-reacted precursor and reaction byproducts from the chamber along the second pathway at a fourteenth (14th) flow rate greater than the second (2nd) flow rate followed by opening the at least one pumping valve while maintaining open the at least one additional pumping valve and for at least one further first predetermined purging time to remove un-reacted precursor and reaction byproducts from the chamber along the first and second pathways at a sixteenth (16th) flow rate greater than the second (2nd) flow rate and the fourteenth (14th) flow rate.

15. The apparatus of claim 14, a further comprising a gas diffuser connected to the outlet end of the tube, the gas diffuser configured to introduce a precursor into the chamber in a gentle and smooth manner.

16. The apparatus of claim 14, wherein the at least one pumping valve comprises an adjustable valve and the at least one additional pumping valve comprises an adjustable valve; and g. the controller is configured to control:

f. i. (1) the sequence of the first precursor purge step further comprising:

adjusting the at least one pumping valve during at least one of the predetermined purging times to remove un-reacted precursor and any reaction byproducts from the chamber along the first pathway at a flow rate greater than the flow rate associated with the un-adjusted, open at least one pumping valve, or adjusting the at least one additional pumping valve during at least one of the predetermined purging times to remove un-reacted precursor and any reaction byproducts from the chamber along the second pathway at a flow rate greater than the flow rate associated with the un-adjusted, open at least additional one pumping valve, or adjusting the at least one pumping valve and adjusting the at least one additional pumping valve during at least one of the predetermined purging times to remove un-reacted precursor and any reaction byproducts from the chamber along the first and second pathways at a flow rate greater than the flow rate associated with the un-adjusted, open at least one pumping valve and the un-adjusted, open at least one additional pumping valve;

and/or f. i. (2) the sequence of the second precursor purge step further comprising:

adjusting the at least one pumping valve during at least one of the predetermined purging times to remove un-reacted precursor and any reaction byproducts from the chamber along the first pathway at a flow rate greater than the flow rate associated with the un-adjusted, open at least one pumping valve, or adjusting the at least one additional pumping valve during at least one of the predetermined purging times to remove un-reacted precursor and any reaction byproducts from the chamber along the second pathway at a flow rate greater than the flow rate associated with the un-adjusted, open at least additional one pumping valve, or adjusting the at least one pumping valve and adjusting the at least one additional pumping valve during at least one of the predetermined purging times to remove un-reacted precursor and any reaction byproducts from the chamber along the first and second pathways at a flow rate greater than the flow rate associated with the un-adjusted, open at least one pumping valve and the un-adjusted, open at least one additional pumping valve.

17. The apparatus of claim 14, wherein the end of the hollow shaft is configured to releasably couple to the at least one chamber opening either with a KF flange or NW flange so as to facilitate powdered or small fibrous materials sample exchange by chamber installation and detachment.

18. The apparatus of claim 14, wherein a cross-section of the chamber perpendicular to the chamber rotation axis comprises a noncircular cross-section.

19. The apparatus of claim 14, further comprising extruding structures on an inner surface of the chamber configured to agitate the powdered or small fibrous materials during the rotary motion of the chamber.

20. The apparatus of claim 14, wherein f. the controller is further configured to:

f. i. control the opening and closing of the main gas valve, f. i. (1) the sequence of the first precursor purge step further comprises:

closing the main gas valve, or f. i. (2) sequence of the second precursor purge step further comprises:

closing the main gas valve, or f. i. (1) the sequence of the first precursor purge step further comprises:

closing the main gas valve, and f. i. (2) the sequence of the second precursor purge step further comprises:

closing the main gas valve.

\* \* \* \* \*